(12) United States Patent
Fisher et al.

(10) Patent No.: US 6,653,202 B1
(45) Date of Patent: Nov. 25, 2003

(54) METHOD OF SHALLOW TRENCH ISOLATION (STI) FORMATION USING AMORPHOUS CARBON

(75) Inventors: Philip A. Fisher, Foster City, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/347,064

(22) Filed: Jan. 17, 2003

(51) Int. Cl.[7] .............................................. H01L 21/762
(52) U.S. Cl. ....................................... 438/424; 438/692
(58) Field of Search ................................ 438/424, 427, 438/435, 692, FOR 227

(56) References Cited

U.S. PATENT DOCUMENTS

| | | | |
|---|---|---|---|
| 6,103,625 A | * | 8/2000 | Marcyk et al. ............. 438/691 |
| 6,368,924 B1 | | 4/2002 | Mancini et al. |
| 2001/0000242 A1 | * | 4/2001 | Huang ........................ 438/106 |
| 2001/0016411 A1 | * | 8/2001 | Petrarca et al. ............. 438/622 |
| 2002/0048959 A1 | * | 4/2002 | Clevenger et al. .......... 438/692 |

* cited by examiner

Primary Examiner—George Fourson
(74) Attorney, Agent, or Firm—Foley & Lardner

(57) ABSTRACT

An exemplary embodiment relates to a method of shallow trench isolation (STI) formation using amorphous carbon as a sacrificial polish stop layer. The method can include polishing a silicon dioxide layer located above a wafer, polishing portions of the silicon dioxide layer located in a field area and portions of an amorphous carbon layer located in an active area. Portions of the amorphous carbon layer are polished down to a hard polish stop layer. The method can also include ashing away residual amorphous carbon from the amorphous carbon layer.

20 Claims, 3 Drawing Sheets

METHOD OF SHALLOW TRENCH ISOLATION (STI) FORMATION USING AMORPHOUS CARBON

FIELD OF THE INVENTION

The present disclosure relates generally to integrated circuits and methods of manufacturing integrated circuits. More particularly, the present disclosure relates to a method of shallow trench isolation (STI) formation using amorphous carbon.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

A variety of different isolation techniques can be employed to provide electrical isolation between devices fabricated on the same piece of silicon. One isolation technique is local oxidation of silicon (LOCOS). LOCOS is often employed to electrically insulate or isolate various portions or structures of the semiconductor device from other portions of the device. Another isolation technique for isolating devices of the same type is shallow trench isolation (STI).

In general, conventional STI formation uses a thick layer of nitride as a hard mask. The nitride thickness depends on the lithography printing capability, normally at the range of 1400–1800 Angstroms (Å). This nitride layer or hard mask is patterned and the substrate beneath it is etched to form trenches in accordance with the pattern. After the trenches are formed, they are filled with an insulative material such as silicon dioxide ($SiO_2$).

The nitride provides a chemical-mechanical polish (CMP) stop layer for subsequent etching steps and can serve as an anti-reflective coating (ARC). The trench filled material (e.g., silicon dioxide) is removed after trench oxide gap fill. A chemical mechanical polish (CMP) selective to silicon dioxide with the nitride layer as an etch stop is conventionally used to remove the trench fill material. Nitride can be detected in the polishing of a tetraethyl orthosilicate (TEOS) using the hardness characteristic of nitride. An over-polish can be utilized into the nitride, assuming a known polish rate. After the trench filled material is removed, the nitride layer is removed according to a CMP process selective to nitride silicon.

After the nitride layer is removed, an uneven formation or relatively large step may be created on the top surface of the substrate. The large step is due to the height of the oxide gap fill in the trench which generally has the same height as the original nitride layer. Disadvantageously, residual material or "poly stringer" from subsequent deposition, masking, and photolithographic steps can form along the large step. Failure to remove this material can lead to unwanted electrical shorting paths between adjacent lines.

Unfortunately, over-polish of nitride suffers from lack of a well-defined end-point signal. It is likely then that the over-polish can leave too much nitride or, alternatively, polish too far and damage the active region in the substrate. If too much nitride is left, there is a large active-field step between the nitride-covered active and the STI. Such a large active-field step can result in poor patterning at step edges and on the field. It is difficult to know when the over-polish has gone too far because the hardness of the nitride is relatively similar to silicon.

Such challenges are not limited to STI formation, but can also apply to the formation processes of gate trenches, conductive line trenches or any of a variety of integrated circuit features.

Thus, there is a need to provide a more defined end-point signal for accurate polishing in integrated circuit fabrication. Further, there is a need to use amorphous carbon as a sacrificial polish stop layer in STI formation for improved chemical mechanical polish (CMP) controllability. Even further, there is a need to improve the active-field step in a CMP.

SUMMARY OF THE INVENTION

An exemplary embodiment relates to a method of shallow trench isolation (STI) formation using amorphous carbon as a sacrificial polish stop layer. The method can include polishing a silicon dioxide layer located above a wafer, polishing portions of the silicon dioxide layer located in a field area and portions of an amorphous carbon layer located in an active area. Portions of the amorphous carbon layer are polished down to a hard polish stop layer. The method can also include ashing away residual amorphous carbon from the amorphous carbon layer.

Another exemplary embodiment relates to a method of feature formation using amorphous carbon as a sacrificial layer to form a defined end point and improved field step. The method can include polishing portions of an amorphous carbon layer located in active regions and polishing portions of an oxide layer located in field regions. Portions of the amorphous carbon layer are polished down to a stop layer located below the amorphous carbon layer and the oxide layer is polished down to approximately the same cross-sectional level as the stop layer. The method can also include ashing away any remaining portions of the amorphous carbon layer.

Another exemplary embodiment relates to a method of more accurately polishing layers during formation of an integrated circuit feature in a trench. The method can include forming a trench in a trench region, providing an amorphous carbon layer above a polish stop layer in a region proximate the trench region, depositing a material above the amorphous carbon layer and in the trench, polishing the material and the amorphous carbon layer down to a horizontal cross-section defined by the polish stop layer, and ashing away any remaining amorphous carbon from the polished amorphous carbon layer.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DETAILED DESCRIPTION OF THE EXEMPLARY EMBODIMENTS

Figure 1:
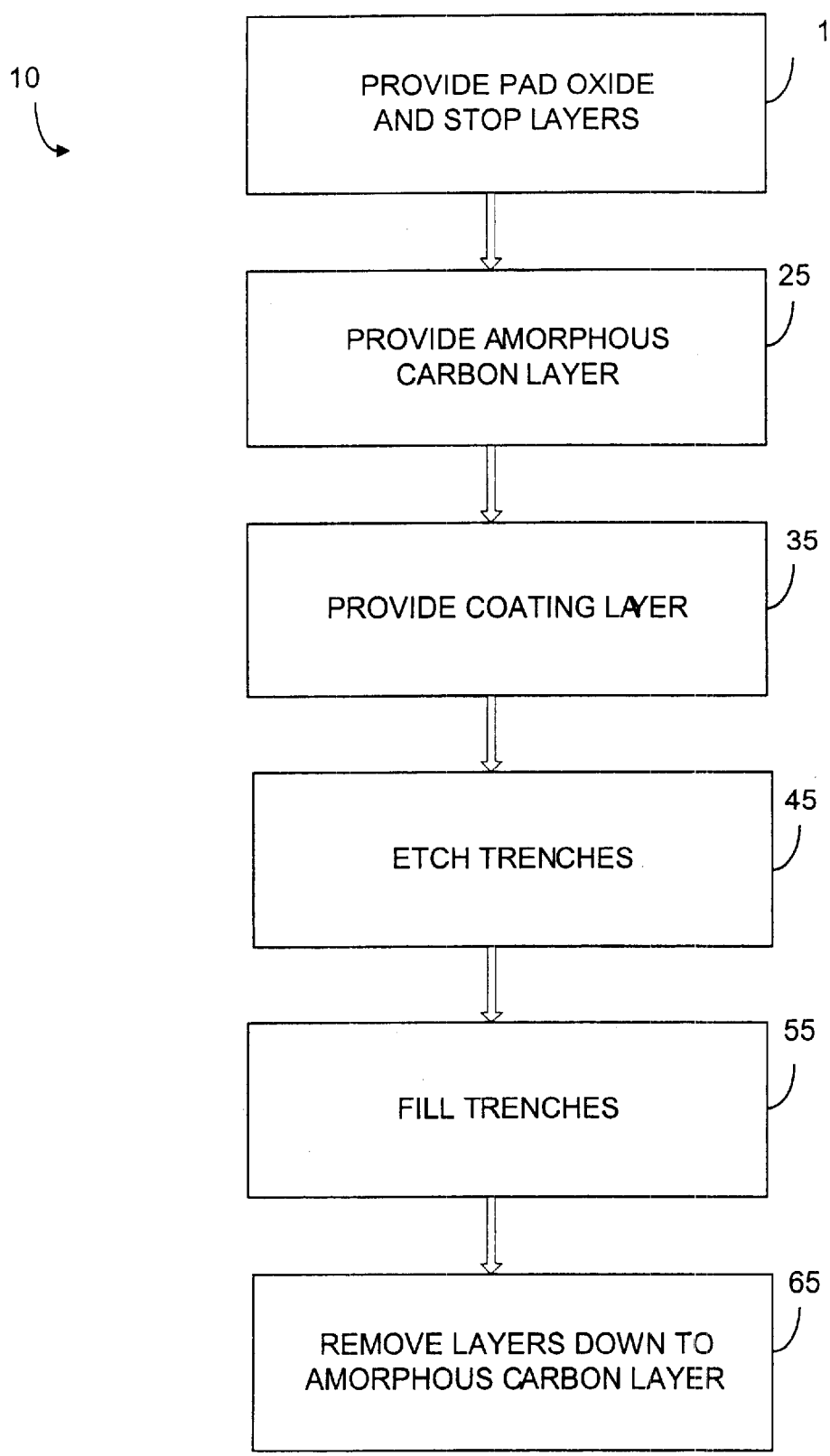
FIG. 1 is a flow diagram for a process of shallow trench isolation (STI) formation using amorphous carbon in accordance with an exemplary embodiment.

FIG. 1 illustrates a flow diagram 10 of an exemplary process of shallow trench isolation (STI) formation using amorphous carbon. Flow diagram 10 illustrates by way of example some operations that may be performed. Additional operations, fewer operations, or combination of operations may be utilized in various different embodiments.

In an exemplary embodiment, an operation 15 can be performed in which a pad oxide layer and a hard polish stop layer are provided over a silicon substrate. In an exemplary embodiment, pad oxide layer and a hard polish stop layer can be provided using a plasma enhanced chemical vapor deposition (PECVD) deposition process. The pad oxide layer can have a thickness of 10–100 Angstroms and the hard polish stop layer can have a thickness of 100–500 Angstroms.

After operation 15, an operation 25 can be performed in which an amorphous carbon layer can be provided above the hard polish stop layer. The amorphous carbon layer can be provided using a chemical vapor deposition (CVD) process or another suitable technique. The amorphous carbon layer can have a thickness of 800–1000 Angstroms.

An operation 35 can be performed in which a coating layer is provided above the amorphous carbon layer. The coating layer can be a SiON layer and can have a thickness of 100–500 Angstroms. The coating layer can be deposited using a chemical vapor deposition (CVD) deposition process.

An operation 45 can be performed in which trenches are formed in the coating layer, amorphous carbon layer, hard polish stop layer, pad oxide layer, and the silicon substrate. The trenches can be used in the formation of an isolation structure or another integrated circuit feature, such as a gate structure. The trenches can be formed using a selective etching process.

An operation 55 can be performed in which the trenches are filled with a material, such as silicon dioxide. Other oxide materials can be used to fill the trenches. The fill material can be provided using a tetraethyl orthosilicate (TEOS) process. Alternatively, other types of materials can be provided, depending on the integrated circuit feature being formed in the trench.

An operation 65 can be performed in which portions of the oxide layer, the coating layer, and the amorphous carbon layer are removed. The removal process can include a chemical mechanical polish (CMP). Advantageously, due to the physical characteristics of amorphous carbon, it is possible to detect when the amorphous carbon layer has been completely polished. Detecting the end point for polishing helps to stop polishing at a point where the oxide layer and the hard polish layer are substantially planar.

Figure 2:
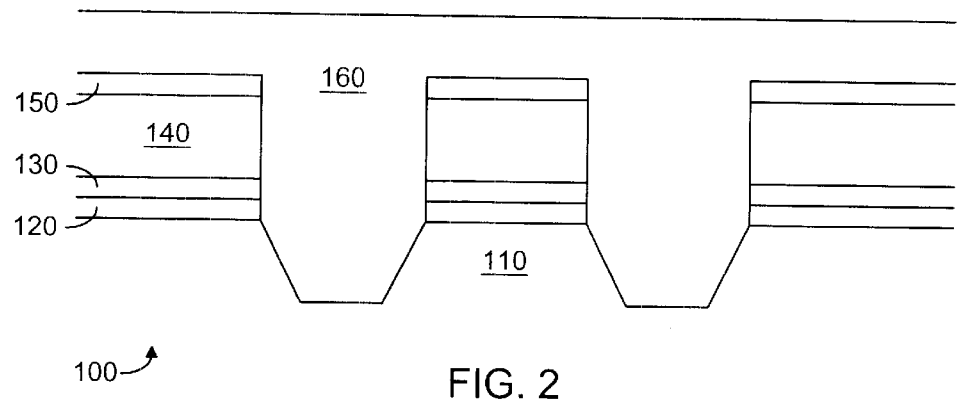
FIG. 2 is a schematic cross-sectional view representation of a portion of an integrated circuit fabricated in accordance with an exemplary embodiment.

Referring to FIG. 2, a portion 100 of an integrated circuit includes a silicon substrate 110, a pad oxide layer 120, a hard polish stop layer 130, an amorphous carbon layer 140, a coating layer 150, and a tetraethyl orthosilicate (TEOS) layer 160. TEOS layer 160 can occupy apertures in silicon substrate 110 configured for the formation of shallow trench isolation (STI) features.

Pad oxide layer 120 can be a dielectric layer providing insulation for silicon substrate 110. Pad oxide layer 120 can have a thickness of, for example, 50 Angstroms. Hard polish stop layer 130 can be a thick pad oxide layer or a layer of hard material providing a stopping point for polishing procedures. Hard polish stop layer 130 can have a thickness of 250 Angstroms.

Amorphous carbon layer 140 can be optically absorbing. As such, a laser reflectance signal can be used to facilitate end pointing. Amorphous carbon layer 140 can have a thickness of 1000 Angstroms. Amorphous carbon layer 140 has less resistance to polish such that there is a substantial difference in resistance to polish between amorphous carbon layer 140 and hard polish stop layer 130. Thus, when amorphous carbon layer 140 is polished down to hard polish stop layer 130, it becomes much harder to polish.

Coating layer 150 can be a layer of SiON or SiRN or any kind of lithographic anti-reflective coating (ARC). Coating layer 150 can have a thickness of 4000–10000 Angstrom. TEOS layer 160 can be a layer of dielectric material, such as, oxide. Preferably, TEOS layer 160 is a silicon dioxide layer deposited by tetraethyl orthosilicate chemical vapor deposition. TEOS layer 160 extends through apertures in coating layer 150, amorphous carbon layer 140, hard polish stop layer 130, pad oxide layer 120, and silicon substrate 110.

In an exemplary embodiment, pad oxide layer 120 is thermally grown or deposited by chemical vapor deposition (CVD). Hard polish stop layer 130 can be deposited by conventional techniques. Amorphous carbon layer can be deposited by CVD. TEOS layer 160 can be deposited by CVD. Alternatively, other deposition techniques may be employed.

Advantageously, use of amorphous carbon layer 140 as a sacrificial layer in the formation of STI structures improves the process by avoiding the need for additional over-polish steps. Further, amorphous carbon layer 140 helps in the creation of a less of a active-field step than the step created in the conventional STI formation process. For example, the active-field step created using amorphous carbon layer 140 can be 10–30% less than a typical active-field step created using conventional techniques.

Figure 3:
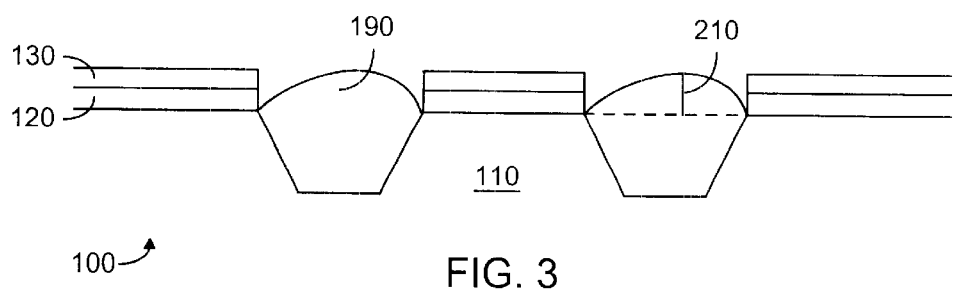
FIG. 3 is a schematic cross-sectional view representation of the portion of the integrated circuit of FIG. 3, showing an isolation structure formation step.

FIG. 3 illustrates portion 100 after polishing steps to remove portions of TEOS layer 160, coating layer 150, and amorphous carbon layer 140. In an exemplary embodiment, portions of TEOS layer 160, coating layer 150, and amorphous carbon layer 140 are removed using chemical mechanical polish (CMP) processes. Other removal techniques can also be employed.

After the removal process, an ashing process can be performed to ash away residual material from removed amorphous carbon layer 140. For example, an $O_2$ plasma can be introduced to remove any amorphous carbon remaining.

As discussed with reference to FIG. 2, hard polish stop layer 130 is used to provide an end point for polishing of amorphous carbon layer 140 and portions of TEOS layer 190. After removal of amorphous carbon layer 140 and portions of TEOS layer 190, hard polish stop layer 130 is removed to form STI structures 190. Removing hard polish stop layer 130 leaves a step 210 from the top of STI structures 190 to the top of pad oxide 120. Advantageously, the height of step 210 is not as great as steps formed in conventional processes.

Figure 4:
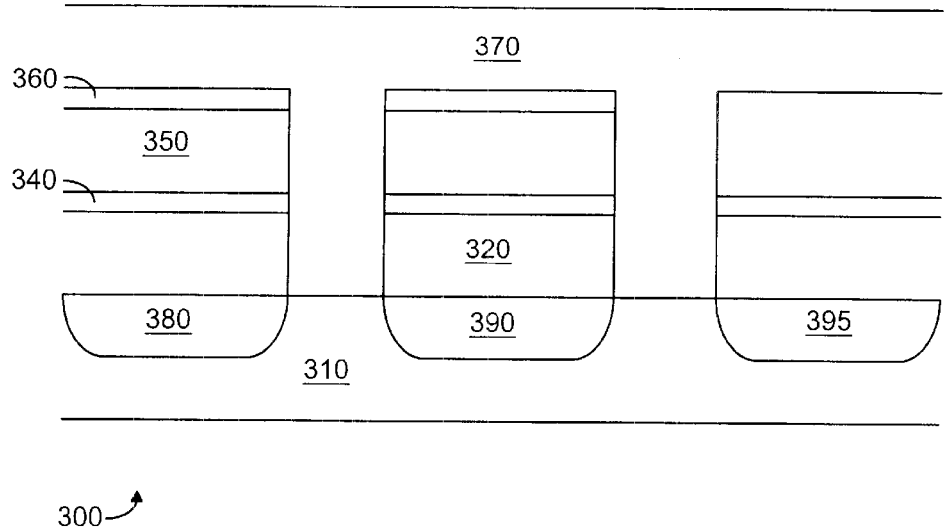
FIG. 4 is a schematic cross-sectional view representation of a portion of an integrated circuit, showing a gate formation step in accordance with an exemplary embodiment.

Referring now to FIG. 4, a portion 300 illustrates one of a number of different alternative embodiments possible. Portion 300 can include a substrate 310, an oxide layer 320, a hard polish stop layer 340, an amorphous carbon layer 350, a coating layer 360, a gate material layer 370, an active region 380, an active region 390, and an active region 395.

Oxide layer 320 can include silicon dioxide ($SiO_2$) and can have a thickness in the range of 800 and 1000 Angstroms. Hard polish stop layer 340 can be a hard material that provides a stopping point for polishing procedures.

Amorphous carbon layer 350 is selected to have a substantially different resistance characteristic than hard polish stop layer 340. In an exemplary embodiment, amorphous carbon layer 350 can have a thickness of 900 Angstroms. Coating layer 360 can be any of a variety of anti-reflective coatings. Gate material layer 370 can be aluminum or any other suitable material used in gate structures.

Active regions 380, 390, and 395 are regions located in substrate 310 that include implants or dopants previously provided to form electrically active areas, such as source and drain regions.

In an exemplary embodiment, a chemical mechanical polish (CMP) process can be used to form gate structures from gate material layer 370. The CMP or other such removal process can stop more accurately at hard polish stop layer 140 because of the polish characteristics of amorphous carbon layer 350.

Once gate structures are formed by removing portions of gate material layer 370, other removal technique can be utilized to remove hard polish layer 340, pad oxide layer 330, and oxide layer 320. For example, a chemical mechanical polish (CMP) process can be used. Alternatively, hard polish layer 340 and oxide layer 320 are not removed.

Figure 5:
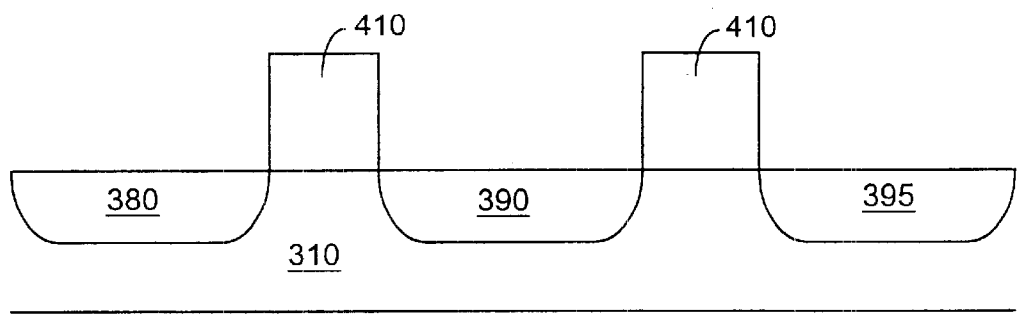
FIG. 5 is a schematic cross-sectional view representation of the portion of the integrated circuit of FIG. 4, showing a gate formed in accordance with another exemplary embodiment.

FIG. 5 illustrates portion 300 after formation of gate structures 410. In an exemplary embodiment, hard polish layer 340 is removed using a chemical mechanical polish process. Active regions 380, 390, and 395 can provide source and drain regions for gate structures 410.

While the exemplary embodiments illustrated in the FIGURES and described above are presently preferred, it should be understood that these embodiments are offered by way of example only. Other embodiments may include, for example, formation any of a variety of different integrated circuit features. The invention is not limited to a particular embodiment, but extends to various modifications, combinations, and permutations that nevertheless fall within the scope and spirit of the appended claims.

What is claimed is:

1. A method of shallow trench isolation (STI) formation using amorphous carbon as a sacrificial polish stop layer, the method comprising:

polishing a silicon dioxide layer located above a wafer;

polishing portions of the silicon dioxide layer located in a field area and portions of an amorphous carbon layer located in an active area, wherein portions of the amorphous carbon layer are polished down to a hard polish stop layer; and ashing away residual amorphous carbon from the amorphous carbon layer.

2. The method of claim 1, wherein the amorphous carbon layer has a thickness of 800–1000 Angstroms.

3. The method of claim 1, wherein the polishing portions of an amorphous carbon layer stops at a hard polish stop layer.

4. The method of claim 3, wherein the hard polish stop layer is a pad oxide.

5. The method of claim 1, wherein the polishing portions of the silicon dioxide layer and polishing portions of an amorphous carbon layer result in an active field step.

6. The method of claim 5, wherein the active field step is 10 Angstroms in size.

7. The method of claim 1, where the amorphous carbon layer is optically absorbing.

8. The method of claim 7, further comprising applying a laser reflectance signal to facilitate end pointing.

9. The method of claim 1, wherein a SiON layer is located between the silicon dioxide layer and the amorphous carbon layer.

10. A method of feature formation using amorphous carbon as a sacrificial layer to form a defined end point and improved field step, the method comprising:

polishing portions of an amorphous carbon layer located in active regions and polishing portions of an oxide layer located in field regions, wherein portions of the amorphous carbon layer are polished down to a stop layer located below the amorphous carbon layer and the oxide layer is polished down to approximately the same cross-sectional level as the stop layer; and ashing away any remaining portions of the amorphous carbon layer.

11. The method of claim 10, wherein the amorphous carbon layer has a cross-sectional thickness of 800–1000 Angstroms.

12. The method of claim 10, further comprising applying a signal to identify end points for polishing.

13. The method of claim 10, wherein the amorphous carbon layer has much less resistance to polish than nitride.

14. The method of claim 10, further comprising applying a pressure sensing signal to identify when the amorphous carbon signal has been polished.

15. A method of more accurately polishing layers during formation of an integrated circuit feature in a trench, the method comprising:

forming a trench in a trench region;

providing an amorphous carbon layer above a polish stop layer in a region proximate the trench region;

depositing a material above the amorphous carbon layer and in the trench;

polishing the material and the amorphous carbon layer down to a horizontal cross-section defined by the polish stop layer; and ashing away any remaining amorphous carbon from the polished amorphous carbon layer.

16. The method of claim 15, wherein the amorphous carbon layer has a thickness of between 800 and 1000 Angstroms.

17. The method of claim 15, further comprising applying a signal to identify polishing end points.

18. The method of claim 17, wherein the signal is a pressure sensing signal.

19. The method of claim 17, wherein the signal is an optical signal.

20. The method of claim 15, wherein the trench is a gate trench and the material is a conductive material.

* * * * *